United States Patent [19]
Shinmori

[11] Patent Number: 5,812,486
[45] Date of Patent: Sep. 22, 1998

[54] DUAL PORT RAM

[75] Inventor: Nobuaki Shinmori, Miyazaki, Japan

[73] Assignee: Oki Electric Industry Co., Ltd., Tokyo, Japan

[21] Appl. No.: 681,352

[22] Filed: Jul. 23, 1996

[30] Foreign Application Priority Data

Jul. 25, 1995 [JP] Japan .................................. 7-188698

[51] Int. Cl.$^6$ .................................................. G11C 8/00
[52] U.S. Cl. .............................. 365/230.08; 365/189.05; 365/230.05
[58] Field of Search ............. 365/230.08, 189.05–230.05

[56] References Cited

U.S. PATENT DOCUMENTS 5,323,355  6/1994  Kato .................................. 365/230.08
5,375,089  12/1994  Lo ...................................... 365/189.05
5,572,477  11/1996  Juns .................................... 365/189.05

Primary Examiner—A. Zarabian
Attorney, Agent, or Firm—Rabin, Champagne, & Lynt, P.C.

[57] ABSTRACT

A structure for the data processing device, including a memory cell array part having a plurality of memory cells for storing data, first and second address terminals for receiving address signals, a first controller for receiving a first read signal and generating a first read control signal, a second controller for receiving a second read signal and generating a second read control signal, a first latch circuit for holding data provided by a memory cell corresponding to an address signal provided at the first address terminal in response to the first read control signal, and a second latch circuit for holding data provided by a memory cell corresponding to the address signal provided at the second address terminal in response to the second read control signal.

5 Claims, 9 Drawing Sheets

0# DUAL PORT RAM

BACKGROUND OF THE INVENTION

1. Field of the Invention

The present invention relates to a data processing device including a plurality of microprocessor units (hereinafter referred to as "MPUs") and a dual port memory device having a plurality of ports for carrying out data reading (writing).

2. Description of the Related Art

The above data processing device generally operates as follows.

For example, two MPUs access the memory device in an asynchronous manner so that, for example, one MPU performs an access operation for reading data present at an address (memory cell) within the memory device and the remaining MPU performs an access operation for writing data at another address (memory cell) within the memory device.

The effect of the above accessing scheme is that data at an address (memory cell) present in the memory device is read-out and externally provided data is written to the other address (memory cell) within the memory device.

However, the case where a single address within the memory device is accessed by the two MPUs at the same time has to be considered because the above accessing of the memory device is carried out in an asynchronous manner. When one of these access operations (one MPU access) is a read operation and the other access operation (other MPU access) is a write operation, there is the undesirable possibility that the data being read may be changed as a result of the data being written.

Improvements are therefore desired when a plurality of MPUs access a single address within the memory device.

SUMMARY OF THE INVENTION

It is therefore an object of the present invention to provide a data processing device capable of reading and writing data in an accurate manner.

It is a further object of the present invention to provide a data processing device in which the speed of data processing is not reduced.

A typical structure for the present invention is as follows.

Namely, the data processing device of the present invention comprises a memory cell array part having a plurality of memory cells for storing data, first and second address terminals for receiving address signals, a first controller for receiving a first read signal and generating a first read control signal, a second controller for receiving a second read signal and generating a second read control signal, a first latch circuit for holding data provided by a memory cell corresponding to an address signal provided at the first address terminal in response to the first read control signal and a second latch circuit for holding data provided by a memory cell corresponding to the address signal provided at the second address terminal in response to the second read control signal.

DESCRIPTION OF THE PREFERRED EMBODIMENTS

First Embodiment

Figure 1:
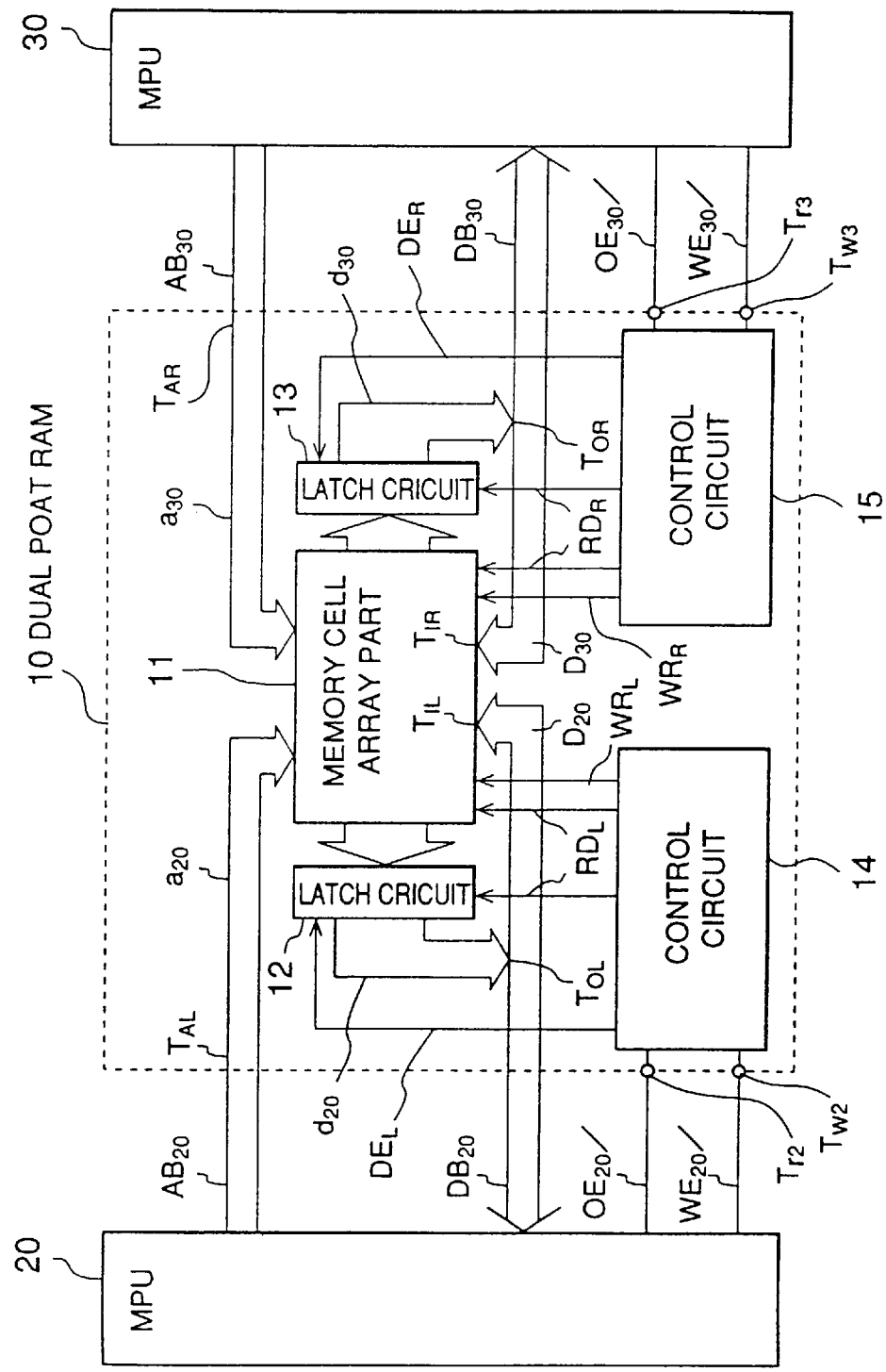
FIG. 1 is a view showing a data processing device of a first embodiment of the present invention.

FIG. 1 is a block diagram showing a first embodiment of the data processing device of the present invention which includes MPUs 20 and 30, and a dual port RAM 10.

This dual port RAM 10 is provided between the two MPUs 20 and 30 and is accessed asynchronously by both MPU 20 and MPU 30. An address bus $AB_{20}$ connected to the MPU 20 is connected to a first address terminal $T_{AL}$ of the dual port RAM 10 and a data bus $DB_{20}$ connected to the MPU 20 is connected to a first data input terminal $T_{IL}$ and a first data output terminal $T_{OL}$. An address bus $AB_{30}$ connected to the MPU 30 is connected to the second address terminal $T_{AR}$ of the dual port RAM 10 and the data bus $DB_{30}$ connected to the MPU 30 is connected to a second data input terminal $T_{IR}$ and a first data output terminal $T_{OR}$. The address busses $AB_{20}$ and $AB_{30}$ provide independant first and second addresses $a_{20}$ and $a_{30}$ for memory access, provided by the MPUs 20 and 30 to a memory cell array part 11. The data buses $DB_{20}$ and $DB_{30}$ provide first and second input data $D_{20}$ and $D_{30}$ to the memory cell array part 11 and transfer first and second output data d20 and d30 of the memory cell array part 11 to the MPUs 20 and 30.

Each of the MPUs 20 and 30 has a function for generating and providing to the dual port RAM 10 independant first and second read signals $OE_{20}/$ and $OE_{30}/$, and independant first and second write signals $WE_{20}/$ and $WE_{30}/$. The structure is such that each of the read signals $OE_{20}/$ and $OE_{30}/$ is provided to each of the first and second read terminals $T_{r2}$ and $T_{r3}$ of the dual port RAM 10 respectively and the write signals $WE_{20}/$ and $WE_{30}/$ are provided to first and second write terminals TW2 and TW3, respectively.

Address terminals $T_{AL}$ and $T_{AR}$ at the dual port RAM 10 are connected to the memory cell array part 11. The other input side of the memory cell array part 11 has a data input terminal $T_{IL}$ and a data input terminal $T_{IR}$. First and second latch circuits 12 and 13 are provided at the two output sides of the memory cell array part 11. The output sides of each of the latch circuits 12 and 13 are connected to data output terminals $T_{OL}$ and $T_{OR}$, respectively. The read terminal $T_{r2}$ and the write terminal TW2 are connected to a first control circuit 14 and the read terminal $T_{r3}$ and the write terminal TW3 are connected to a second control circuit 15. The control circuit 14 generates each of the various control signals based on the read signal $OE_{20}/$ and the write signal $WE_{20}/$. The control circuit 14 also has the functions of: providing a read control signal $RD_L$ and write control signal $WR_L$ for accessing the memory cell array part 11; providing a read control signal $RD_L$ to the latch circuit 12; and providing a control signal DEL for the output side of the latch circuit 12. The control circuit 15 generates each of the various control signals based on the read signal $OE_{30}/$ and the write signal $WE_{30}/$. The control circuit 15 has the functions of: providing a read control signal $RD_R$ and a write control signal $WR_R$ for accessing to the memory cell array part 11; providing a read control signal $RD_R$ to the latch circuit 13 and providing a control signal DER to the output side of the latch circuit 13.

Figure 2:
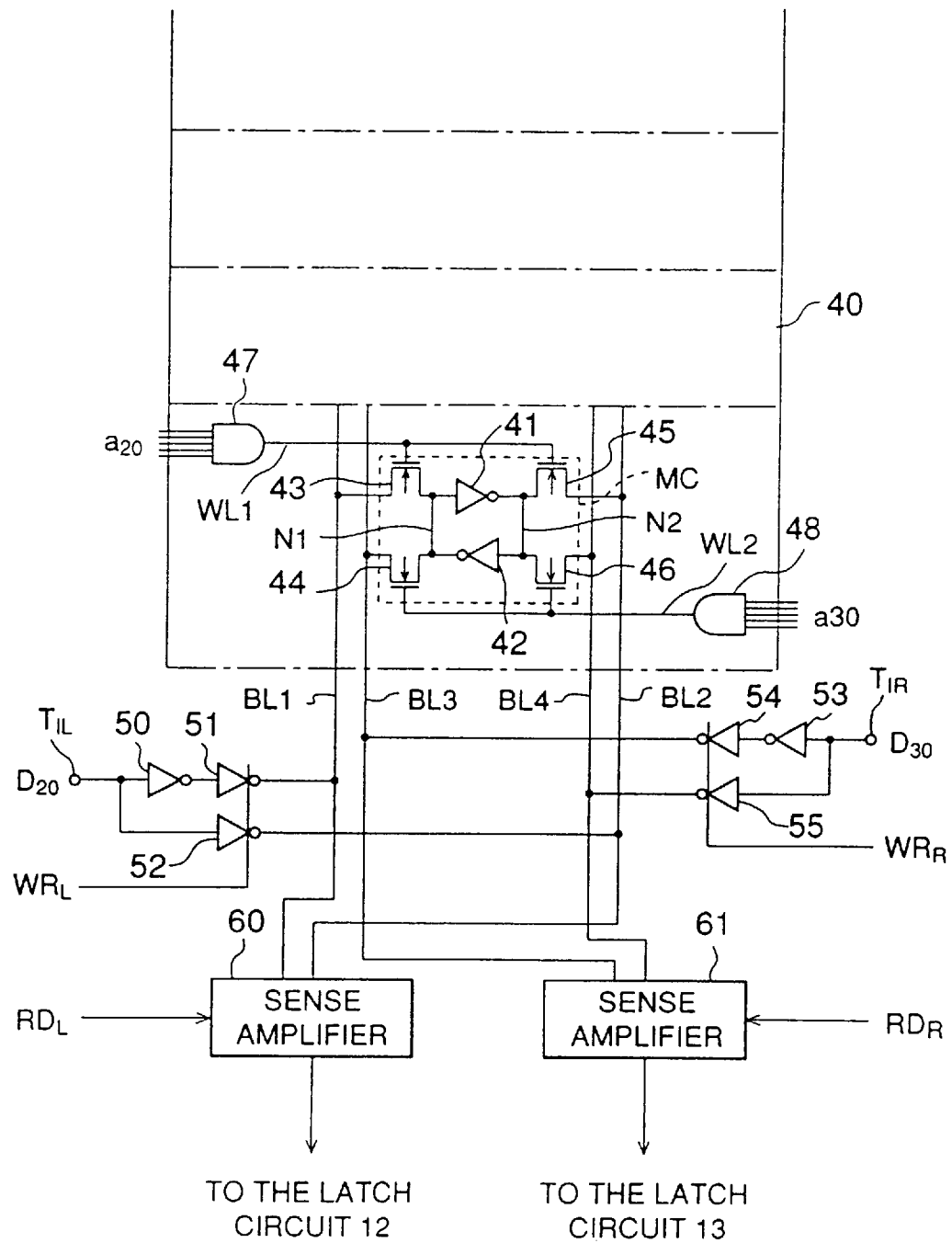
FIG. 2 is a view showing an example structure of the memory cell array part.

FIG. 2 is a block diagram showing an example of a structure for the memory cell array part 11 in FIG. 1.

A memory cell array 40 comprising a plurality of arrayed memory cells MC is provided within the memory cell array part 11. Each memory cell is constructed in the same way and are connected in the same way between four bit lines and two word lines. The memory cell MC shown in FIG. 2 is connected to four bit lines BL1 to BL4 and two word lines WL1 and WL2. The memory cell MC comprises a flip-flop constructed from two cross-coupled inverters 41 and 42 connected end to end so as to be in a loop. Input/output node N1 of two input/output nodes N1 and N2 of the flip-flop is connected to the bit line BL1 via N-type Metal Oxide Semiconductor transistor (hereinafter referred to simply as "NMOS transistor") 43 and to the bit line BL3 via NMOS transistor 44. The input/output node N2 is connected to the bit line BL2 via NMOS transistor 45 and connected to the bit line BL4 via NMOS transistor 46. The gates of NMOS transistor 43 and NMOS transistor 45 are connected to a word line WL1 connected to the decoder 47 and the gates of NMOS transistor 44 and NMOS transistor 46 are connected to the word line WL2 connected to the decoder 48. The addresses $a_{20}$ and $a_{30}$ provided via the address terminals $T_{AL}$ and $T_{AR}$ are provided to each of the decoders 47 and 48.

Connections are such that the input data $D_{20}$ (data from the MPU 20) received from the data input terminal $T_{IL}$ is provided to the bit line BL1 via two inverters 50 and 51 and provided to the bit line BL2 via an inverter 52. The outputs at the output side of the inverters 50 and 51 are controlled by the write control signal $WR_L$, with data being applied to the bit lines BL1 and BL2 only when the level of the write control signal $WR_L$ is valid. Further, connections are such that input data $D_{30}$ (data from the MPU 30) received from a data input terminal $T_{IR}$ is applied to the bit line BL3 via two inverters 53 and 54 and applied to bit line BL4 via an inverter 55. The outputs at the output side of the inverters 54 and 55 are controlled by the write control signal $WR_R$, with data being provided to the bit lines BL3 and BL4 only when the level of this control signal $WR_R$ is valid.

Each of the bit lines BL1 and BL2 is connected to a sense amplifier 60 and each of the bit lines BL3 and BL4 is connected to a sense amplifier 61. The read control signals $RD_L$ (signal from the MPU 20) and $RD_R$ (signal from the MPU 30) are provided to the sense amplifiers 60 and 61, respectively. The read control signal $RD_L$ then becomes the active signal of the sense amplifier 60, with the sense amplifier 60 functioning in such a manner that output data provided from the bit lines BL1 and BL2 is provided to the latch circuit 12 in FIG. 1 for the period where the read control signal $RD_L$ is valid. The read control signal $RD_R$ then becomes the active signal of the sense amplifier 61, with the sense amplifier 61 then functioning in such a manner that output data provided from the bit lines BL3 and BL4 is provided to the latch circuit 13 for the period where the read control signal $RD_R$ is valid.

Figure 3:
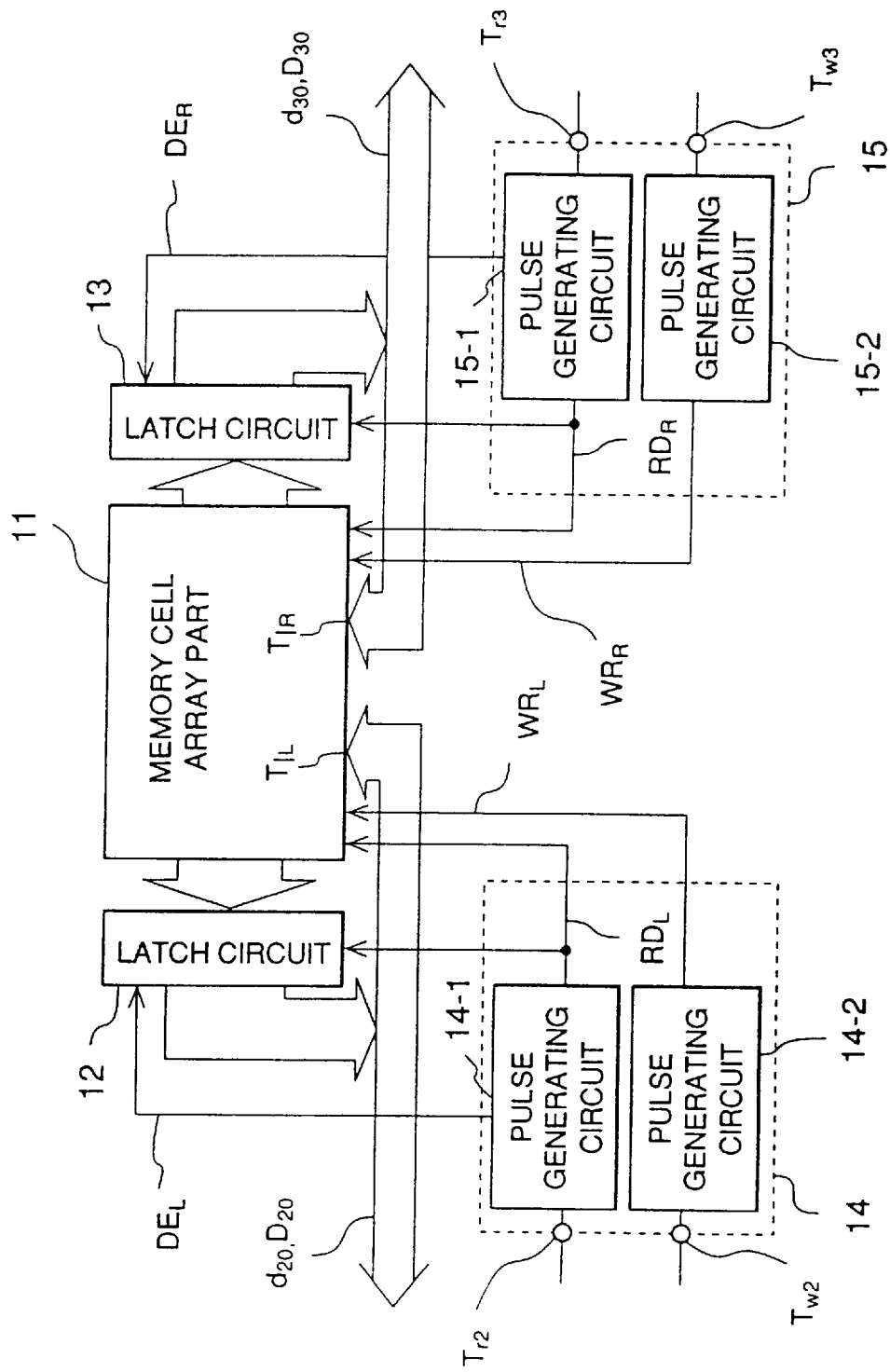
FIG. 3 is a view illustrating the details of the control circuits of the present invention.

FIG. 3 is a block diagram showing the control circuits 14 and 15 of FIG. 1.

The control circuit 14 is equipped with a pulse generating circuit 14-1 connected to the read terminal $T_{r2}$ and a pulse generating circuit 14-2 connected to the write terminal $T_{w2}$. The pulse generating circuit 14-1 generates the read control signal $RD_L$ for setting the timing and the period for reading data out at the latch circuit 12 from the memory cells MC within the memory cell array part 11, and also generates a control signal $DE_L$ for setting the period for transferring data stored in the latch circuit 12 to the MPU 20. The pulse generating circuit 14-2 generates a write control signal $WR_L$ for setting the timing and the period for writing the input data $D_{20}$ provided from the MPU 20 to the memory cells MC.

The control circuit 15 is equipped with a pulse generating circuit 15-1 connected to the read terminal $T_{r3}$ and a pulse generating circuit 15-2 connected to the write terminal $T_{w3}$. The pulse generating circuit 15-1 generates the read control signal $RD_R$ for setting the timing and the period for reading data out at the latch circuit 13 from the memory cells MC within the memory cell array part 11, and also generates control signal $DE_R$ for setting the period for transferring data stored in the latch circuit 13 to the MPU 30. The pulse generating circuit 15-2 generates a write control signal $WR_R$ for setting the timing and the period for writing the input data $D_{30}$ provided from the MPU 30 to the memory cells MC.

Figure 4:
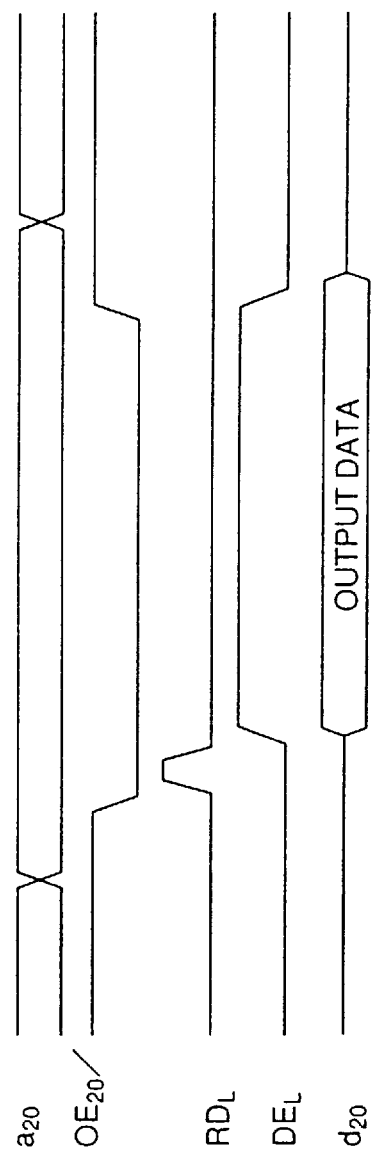
FIG. 4 is a timing diagram showing the read operation for the data processing device of FIG. 1.
Figure 5:
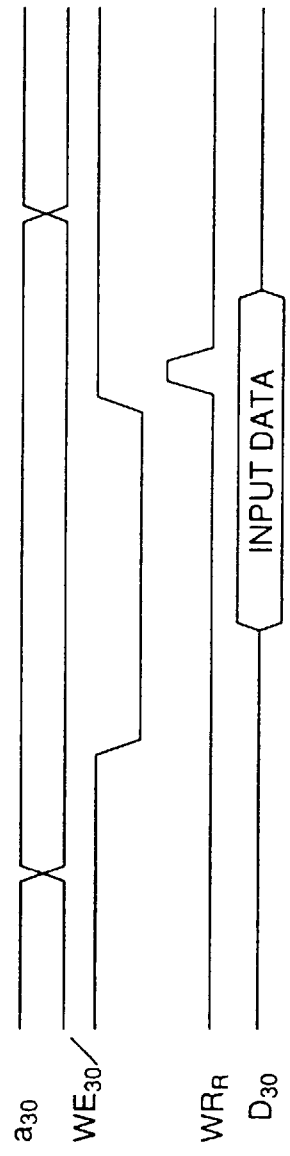
FIG. 5 is a timing diagram showing the write operation for the data processing device of FIG. 1.

FIG. 4 is a timing diagram showing the read operation of the device of FIG. 1 and FIG. 5 is a timing diagram showing the write operation of the device of FIG. 1. The operation of the data processing device of FIG. 1 will now be described with reference to FIG. 4 and FIG. 5.

At the data processing device, data access from the side of the address terminal $T_{AL}$, the data output terminal $T_{OL}$, the data input terminal $T_{IL}$, the read terminal $T_{r2}$, and the write terminal TW2 (i.e. access from the side of the first port), and access from the side of the address terminal $T_{AR}$, the data output terminal $T_{OR}$, the data input terminal $T_{IR}$, the read terminal $T_{r3}$, and the write terminal TW3 (i.e. access from the side of the second port) are carried out asynchronously (i.e. independently) from each other.

First, the case of reading out from the side of the address terminal $T_{AL}$, the data output terminal $T_{OL}$, the data input terminal $T_{IL}$, the read terminal $T_{r2}$, and the write terminal $T_{w2}$ will be described, i.e. the case where the MPU 20 carries out read operations using the first port side is described. The memory cell MC to be read from is selected based on the address $a_{20}$ provided from the MPU 20 via the address terminal $T_{AL}$. Namely, the level of the word line WL1 to which the read target memory cell MC is connected is set to "H". When the word line WL1 goes "H", NMOS transistor 43 and NMOS transistor 45 turn on and the memory cell MC is connected to each of the bit lines BL1 and BL2. When the MPU 20 then puts the read signal $OE_{20}/$ to a valid "L" level, the pulse generating circuit 14-1 within the control circuit 14 sets the read control signal $RD_L$ to a valid "H" level. Namely, the pulse generating circuit 14-1 generates the "H" level pulse for a prescribed beginning directly after the transition of this signal $OE_{20}/$, as shown in FIG. 4. The "H" level read control signal $RD_L$ is applied to the sense amplifier 60, then the sense amplifier 60 is made active. When the sense amplifier 60 becomes active, data for the memory cell MC is amplified via the two bit lines BL1 and BL2, with this data then being provided to the latch circuit 12. The read control signal $RD_L$ is also provided to the latch circuit 12, with the latch circuit 12 storing the data read from the memory cell MC as the output data d20 during the period when the read control signal $RD_L$ is "H" as a result. The pulse generating circuit 14-1 then sets the level of the control signal $DE_L$ to a valid "H" level. The valid period of this control signal $DE_L$ is taken to be from the time when the valid period of the read control signal $RD_L$ finishes until the end of the valid period of the read signal $OE_{20}$/. Output data $d_{20}$ is transferred from the latch circuit 12 to the MPU 20 via the data output terminal $T_{OL}$ and the data bus $DB_{20}$ for the period when the control signal $DE_L$ is valid. The operation for reading out from the side of the address terminal $T_{AR}$, the data output terminal $T_{OR}$, the data input terminal $T_{IR}$, the read terminal $T_{r3}$ and the write terminal $T_{w3}$, i.e. the operation where the MPU 30 performs read operations using the second port side, is carried out in the same way.

Next, the case of writing from the side of the address terminal $T_{AR}$, the data output terminal $T_{OR}$, the data input terminal $T_{IR}$, the read terminal $T_{r3}$, and the write terminal $T_{w3}$, i.e. the case where the MPU 30 performs read operations using the second port side, will be described.

The memory cell MC to be written to is selected based on the address $a_{30}$ provided from the MPU 30 via the address terminal $T_{AR}$. Namely, the decoder 48 puts the level of the word line WL2 connected to the target memory cell MC to "H". The word line WL2 then goes "H", NMOS transistor 44 and NMOS transistor 46 turn on and the memory cell MC is connected to each of the bit lines BL3 and BL4.

On the other hand, when the MPU 30 puts the write signal $WE_{30}$/ to a valid "L" level, the pulse generating circuit 15-2 within the control circuit 15 puts the write control signal $WR_R$ to a valid "H" level. Namely, the pulse generating circuit 15-2 outputs an "H" level pulse for a prescribed period from directly after the end (rising edge) of the change in this signal $WR_R$, as shown in FIG. 5. The "H" level write control signal $WR_R$ is provided to the inverters 54 and 55 within the memory cell array part 11, then each of the inverters 54 and 55 is made active. At this time, the input data $D_{30}$ for writing from the MPU 30 is provided on the data bus $DB_{30}$, with the input data $D_{30}$ then being provided to the inverter 53 and the inverter 55 as a result. The information for the input data $D_{30}$ can then be provided to each of the bit lines BL3 and BL4 because the inverters 54 and 55 are active. The data is then written at the write target memory cell MC connected to the bit lines BL3 and BL4 via the respective bit lines BL3 and BL4. The case of writing from the side of the address terminal $T_{AL}$, data output terminal $T_{OL}$, data input terminal $T_{IL}$, read terminal $T_{r2}$, and write terminal $T_{w2}$, i.e. the case where the MPU 20 carries out write operations using the first port side, is carried out in the same way.

As above, in this first embodiment, latch circuits 12 and 13 for storing data read from the memory cells MC and control circuits 14 and 15 for generating read control signals $RD_L$ and $RD_R$, and write control signals $WR_L$ and $WR_R$ are provided. The output data is stored in the latch circuits 12 and 13 for the valid duration of the read control signals $RD_L$ and $RD_R$ generated by the control circuits 14 and 15, with output data $d_{20}$ and $d_{30}$ then being provided from these latch circuits 12 and 13. Further, writing to the memory cells is carried out during the valid period of each of the write control signals $WR_L$ and $WR_R$. Because of this, in the case where a read and write are requested of the same cell at the same time also, limiting the valid periods of, for example, the read control signal $RD_L$ and the write control signal $WR_R$ so as to not be exactly the same means that problems such as where the read data is changed by the write data, etc. do not occur. The periods for which the read control signals $RD_L$ and $RD_R$, and the write control signals $WR_L$ and $WR_R$ are made valid can then be set to be sufficiently short, in-line with the data reading and writing performance of the memory cell array 40, so that the processing speed throughout the data processing device as a whole does not need to be reduced. Further, because only one of either the reading or writing operations is stopped, it is not necessary to halt the operation of the MPU 20 or the MPU 30 and other processes occurring at the MPUs 20 and 30 are therefore not influenced.

Second Embodiment

In the aforementioned first embodiment, if the periods for which the "H" levels of the read control signal $RD_L$ and the write control signal $WR_R$ coincide when the same memory cell MC is being accessed from the two ports, the possibility that the output data $d_{20}$ may be changed by the write data cannot be discounted. In this second embodiment, a construction is adopted where the control circuits generating the read control signals $RD_L$ and $RD_R$ and the write control signals $WR_L$ and $WR_R$ etc. monitor each other and perform access regulation.

Figure 6:
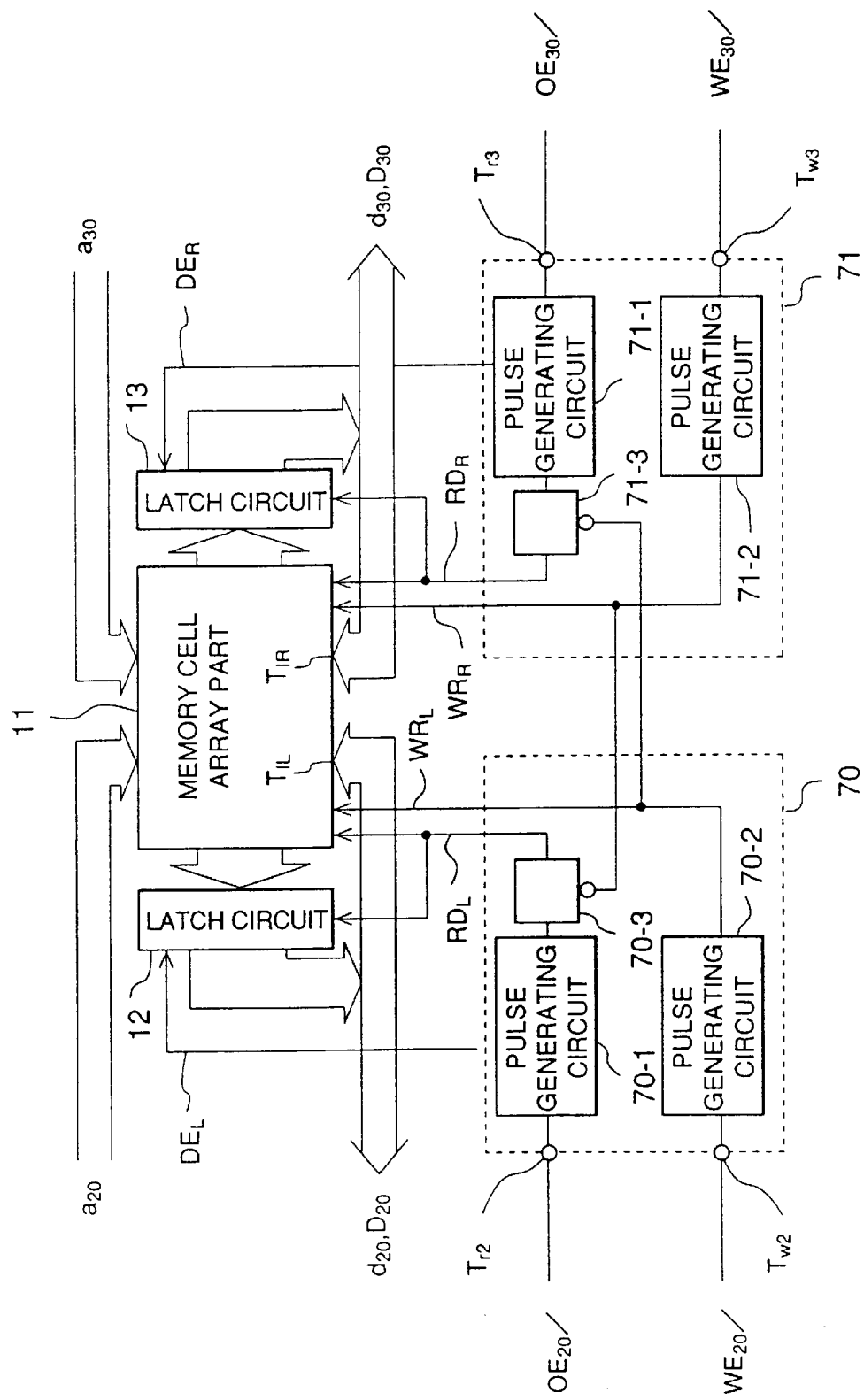
FIG. 6 is a view showing a data processing device of a second embodiment of the present invention.

FIG. 6 is a data processing device showing a second embodiment of the present invention, with elements which are common with elements in FIG. 1 being given common reference characters. Here, the MPUs 20 and 30 are not mentioned.

In this data processing device, the control circuits 14 and 15 within the dual-port RAM 10 shown in FIG. 1 are replaced with control circuits 70 and 71. Other portions, i.e. the memory cell array part 11 and the latch circuits 12 and 13 have the same structure as for the first embodiment.

The control circuit 70 is equipped with a pulse generating circuit 70-1 connected to the read terminal $T_{r2}$ and a pulse generating circuit 70-2 connected to the write terminal $T_{w2}$. The pulse generating circuit 70-1 generates a read control signal $RD_L$ for the memory cell array part 11 and the latch circuit 12, in the same way as the pulse generating circuit 14-1 of the first embodiment, together with a control signal $DE_L$, with a delay circuit 70-3 being connected at the terminal providing this read control signal $RD_L$. The pulse generating circuit 70-2 generates a write control signal $WR_L$ for the memory cells MC. The control circuit 71 is equipped with a pulse generating circuit 71-1 connected to the read terminal $T_{r3}$ and a pulse generating circuit 71-2 connected to the write terminal $T_{w3}$. The pulse generating circuit 71-1 generates a read control signal $RD_R$ for the memory cell array part 11 and the latch circuit 13 as well as generating a control signal $DE_R$, with a delay circuit 71-3 being connected at the terminal providing this read control signal $RD_R$. The pulse generating circuit 71-2 generates a write control signal $WR_R$ for the memory cell MC.

The write control signal $WR_R$ from the pulse generating circuit 71-2 is received as an input to the delay circuit 70-3. The write control signal $WR_L$ from the pulse generating circuit 70-2 is received as an input to the delay circuit 71-3. The control circuits 70 and 71 therefore monitor each others' operations using these connections and access regulation is carried out using the delay circuits 70-3 and 71-3.

Next, the operation of the dual-port RAM of FIG. 6 will be described.

Operations are carried out at the memory cell array part 11 and the latch circuits 12 and 13 based on the addresses $a_{20}$ and $a_{30}$, the read control signals $RD_L$ and $RD_R$, the write control signals $WR_L$ and $WR_R$, and the control signals $DE_L$ and $DE_R$, in the same way as for the first embodiment, with accessing of the memory cell array 40 from the two ports being carried out asynchronously.

Figure 7:
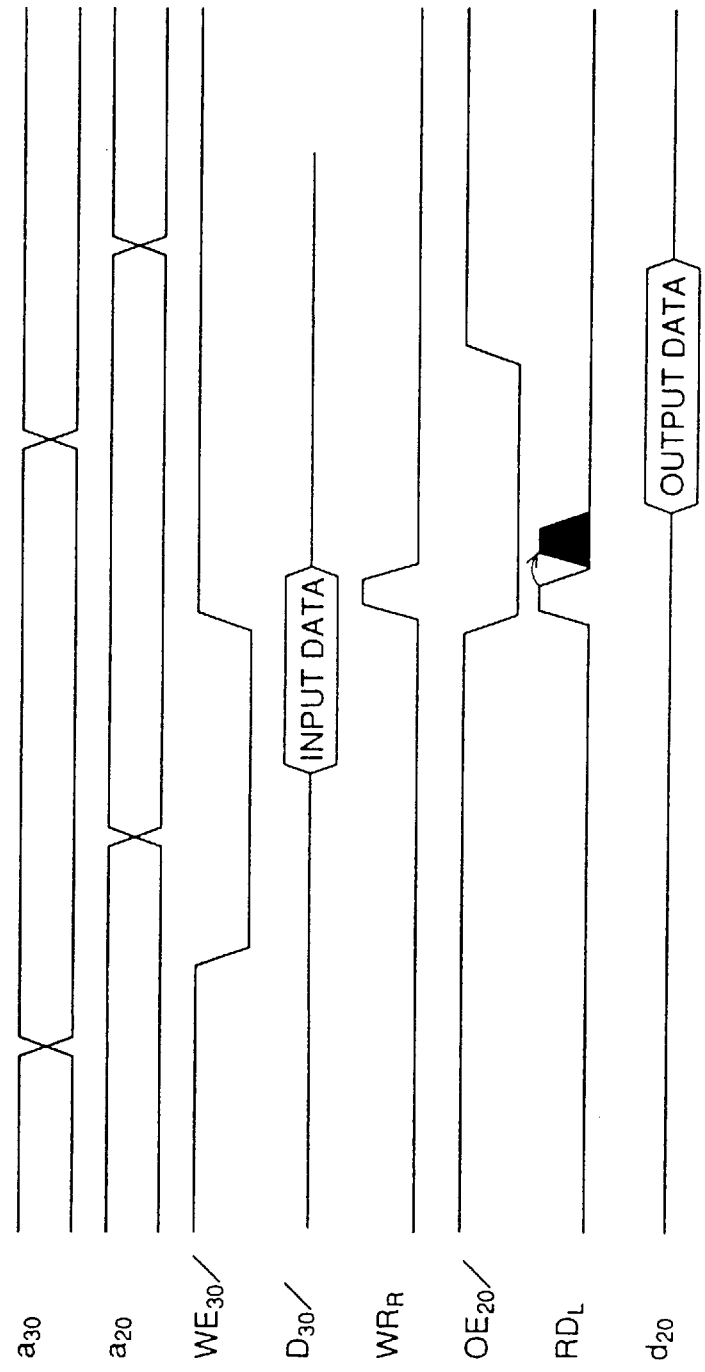
FIG. 7 is a timing diagram showing the operation of the data processing device of the second embodiment of the present invention.

FIG. 7 is a timing diagram showing the data access occurring in the device of FIG. 6. Accessing of the dual-port RAM 10 of FIG. 6 will now be described with reference to FIG. 7.

The pulse generating circuit 71-2 within the control circuit 71 makes the level of the write control signal $WR_R$ a valid "H" level for a prescribed period based on the write signal $WE_{30}/$ received from the write terminal $T_{w3}$, in the same way as for the pulse generating circuit 15-2 of the first embodiment. The pulse generating circuit 70-1 within the control circuit 70 also generates a "H" level read control signal $RD_L$ based on the read signal $OE_{20}/$, in the same way as the pulse generating circuit 14-1 of the first embodiment. The control circuits 70 and 71 monitor each others' operations at the dual port RAM, i.e. the control circuit 70, for example, monitors the state of the write control signal $WR_R$ and when the write control signal $WR_R$ is a valid "H" level, the delay circuit 70-3 delays the read control signal $RD_L$ as shown in FIG. 7. This is the same when the side carrying out the reading and the side carrying out the writing are reversed. Because of this, the write control signal $WR_R$ and the read control signal $RD_L$ do not become a valid "H" level at the same time and the write control signal $WR_L$ and the read control signal $RD_R$ do not become a valid "H" level at the same time.

According to this second embodiment, delay circuits 70-3 and 71-3 are provided, at the control circuits 70 and 71, for monitoring first port side (MPU 20 side) accesses and second port side (MPU 30 side) accesses. The read control signals $RD_L$ and $RD_R$ from the control circuits themselves are made to be delayed in response to the generating conditions of the write control signals $WR_L$ and $WR_R$ generated by control circuits on opposite sides and the timing of the storing of data in the latch circuits 12 and 13 is regulated. Namely, accessing of the memory cells MC from the two ports can be regulated by the control circuits 70 and 71. Because of this, the periods for the timing of the writing of input data $D_{20}$ and $D_{30}$ to a memory cell MC and the timing of reading of data from a memory cell MC to the latch circuits 12 and 13 does not coincide. Indeterminate data is therefore not generated as the output data $d_{20}$ and $d_{30}$ because data is read after writing has been fixed.

Third Embodiment

Figure 8:
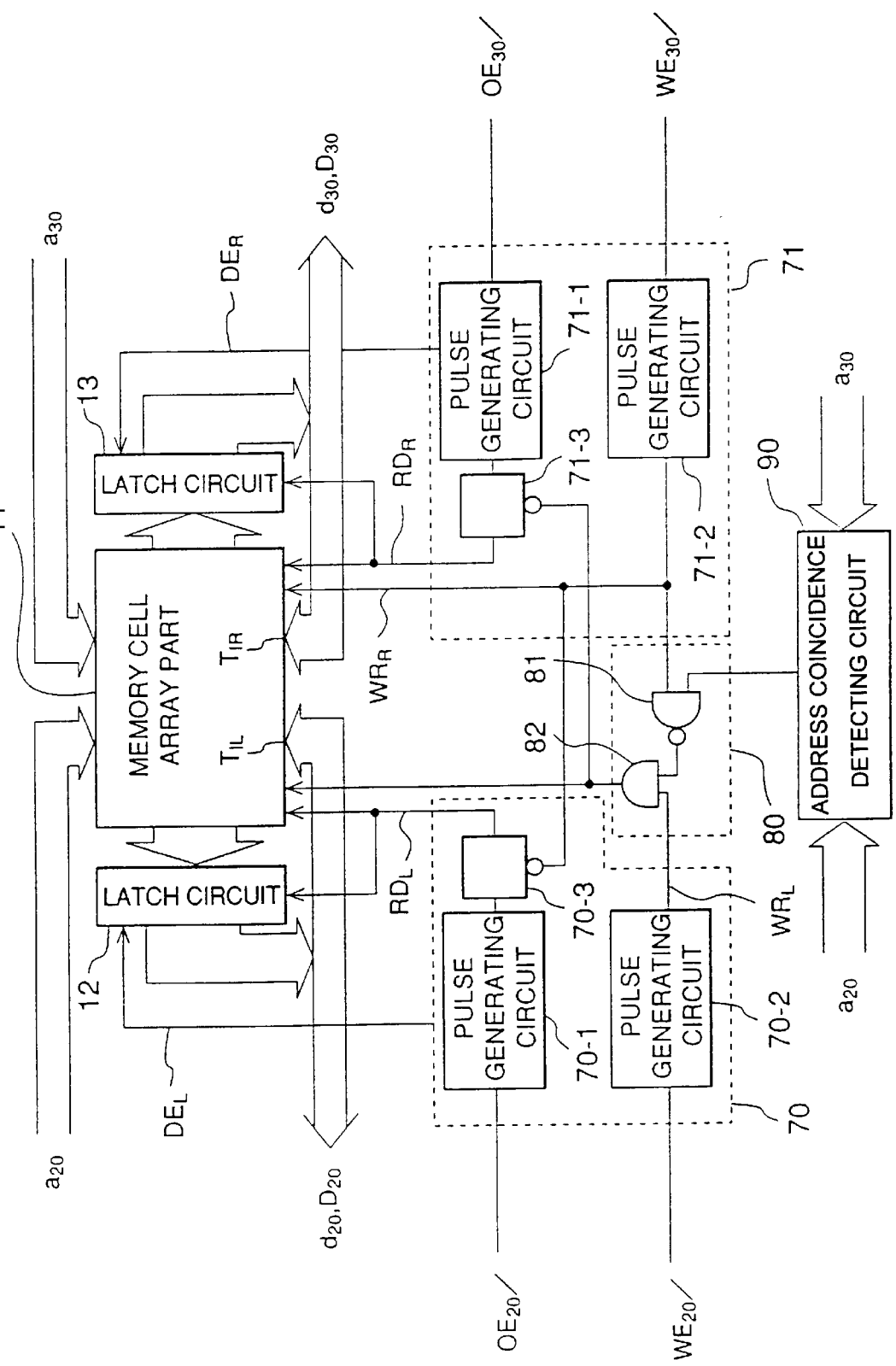
FIG. 8 is a view showing a data processing device of a third embodiment of the present invention.

FIG. 8 is a block diagram of a data processing device showing a third embodiment of the present invention. Elements common with elements in FIG. 1 and FIG. 6 are given common reference characters. The MPUs 20 and 30 are not mentioned.

This data processing device is equipped with a memory cell array part 11, latch circuits 12 and 13 connected to both sides of this memory cell array part 11, and two control circuits 70 and 71 in the same way as the second embodiment of FIG. 6, and is further provided with a write inhibit circuit 80 and an address coincidence detecting circuit 90.

The write inhibit circuit 80 is equipped with a two-input NAND gate 81, with the output terminal of the pulse generating circuit 71-2 within the control circuit 71 being connected to one of the input terminals of this NAND gate 81, and a two-input AND gate 82 with the output terminal of the NAND gate 81 being connected to one of the input terminals of this AND gate 82. The output terminal of the pulse generating circuit 71-2 within the control circuit 71 is connected to the memory cell array part 11 and one of the input terminals of the NAND gate 81. The output terminal of the pulse generating circuit 70-2 within the control circuit 70 is connected to the remaining input terminal of the AND gate 82 and the output terminal of the AND gate 82 is connected to the memory cell array part 11, i.e. the pulse generating circuit 70-2 is connected to the memory cell array part 11 via the write inhibit circuit 80. The address coincidence detecting circuit 90 detects the coincidences between the two addresses $a_{20}$ and $a_{30}$ and the output side of the address coincidence detecting circuit 90 is connected to the remaining input terminal of the NAND gate 82.

Figure 9:
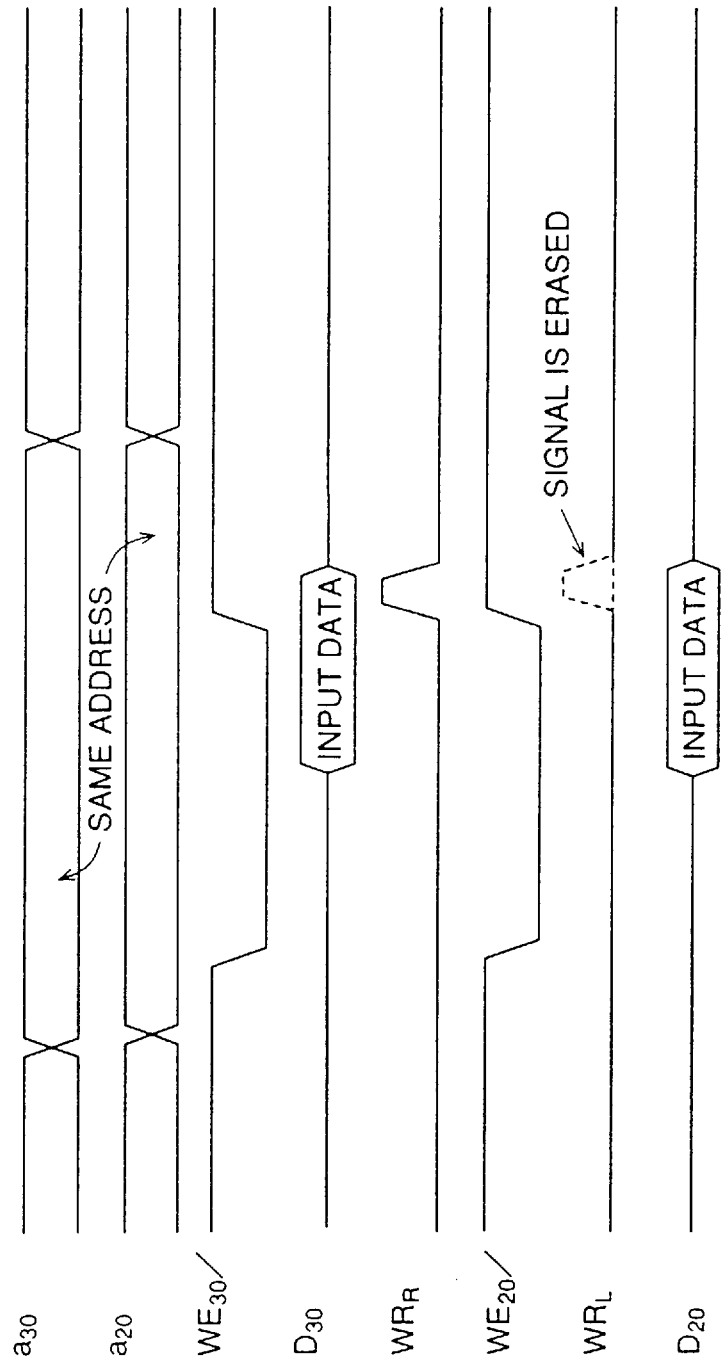
FIG. 9 is a timing diagram showing the operation of the data processing device of the third embodiment of the present invention.

FIG. 9 is a timing diagram illustrating accessing to the dual-port RAM 10 of FIG. 8.

This dual-port RAM 10 has a function for making one of the write requests invalid when write requests occur at the same time for the same memory cell MC within the memory cell array part 11. Accessing for when write requests occur simultaneously for the same memory cell MC are shown in FIG. 9.

When write addresses $a_{20}$ and $a_{30}$ are provided to the memory cell array part 11 from the MPUs 20 and 30 on the two port sides of the dual port RAM 10 at the same time, a memory cell MC corresponding to these addresses $a_{20}$ and $a_{30}$ is selected. The memory cell MC is then connected to the bit lines BL1 to BL4 shown in FIG. 2. On the other hand, the address coincidence detecting circuit 90 detects that these addresses $a_{20}$ and $a_{30}$ coincide and provides an "H" level detection signal to the NAND gate 81. The pulse generating circuits 70-2 and 71-2 then put the write control signals $WR_L$ and $WR_R$ to valid "H" levels based on the write signals $WE_{20}/$ and $WE_{30}/$. The output of the NAND gate 81 therefore becomes "L" and the level of the signal outputted from the AND gate 82 becomes an invalid "L" level. The write control signal $WR_L$ provided to the memory cell array part 11 is then made invalid by the write inhibit circuit 80 and reading in response to a request from the side of the MPU 20 cannot be carried out. On the other hand, the write control signal $WR_R$ is also provided to the memory cell array part 11. Input data provided from the side of the MPU 30 can therefore be written to the selected memory cell MC while the write control signal $WR_R$ is at a valid "H" level.

In this third embodiment, the write inhibit circuit 80 and the address coincidence detecting circuit 90 are provided for the dual port RAM of the second embodiment and the access regulating capabilities due to the control circuits 70 and 71 are reinforced. Because of this, when write requests occur simultaneously for the same memory cell MC, writes from the side of the MPU 20 are invalidated. The write data therefore does not become indeterminate even when the input data from the MPU 20 and the MPU 30 are reversed.

The present invention is by no means limited to the above embodiments, and various modifications are possible. Example modifications are as follows.

(1) With the dual-port RAM for the data processing device of the above embodiments, a structure is adopted where generating and receiving of data is performed in parallel for the MPUs 20 and 30 via the data buses $DB_{20}$ and $DB_{30}$. However, a serial transmission method dual-port RAM may also be used.

(2) In the second embodiment, the write period and read period are shifted regardless of the addresses $a_{20}$ and $a_{30}$. However, an address coincidence detecting circuit 90 may be provided in the same way as for the third embodiment and the write period and read period may be delayed when the addresses $a_{20}$ and $a_{30}$ coincide.

(3) In the third embodiment, writes from the side of the MPU 20 were invalidated but the same effects as for the above embodiments can be obtained by invalidating writes from the side of the MPU 30.

As described in detail above, according to the present invention, the period for writing data to the memory cells does not overlap with the period for reading data out from the memory cells. As a result, the reliability of the data processing device can also be increased because the data does not change or become indeterminate when the same memory cell is accessed via the two ports. This also increases the reliability of the data processing device. Speed of the data processing device also no longer has to be sacrificed because operation of the MPUs does not have to be halted while the dual port RAM is being accessed.

Further, according to the present invention, first port accesses and second port accesses are monitored, with accesses from the two ports being regulated as a result. Therefore, when a write is generated from both sides or a write is carried out from one side and a read from the other with respect to the same memory cell at the same time, the accesses accompanied by changes in the input data and output data are regulated and more reliable results than the results previously shown are obtained.

What is claimed is:

1. A dual port RAM comprising:
    a memory cell array part having a plurality of memory cells for storing data;
    first and second address terminals for receiving read and write address signals;
    a first address bus connected between said first address terminal and said memory cell array part, for receiving read and write address signals at the first address terminal;
    a second address bus connected between said second address terminal and said memory cell array part, for receiving read and write address signals at the second address terminal;
    a first controller for receiving a first read signal and generating a first read control signal;
    a second controller for receiving a second read signal and generating a second read control signal;
    a first latch circuit for holding data provided by a memory cell corresponding to an address signal provided at the first address bus in response to the first read control signal; and
    a second latch circuit for holding data provided by a memory cell corresponding to an address signal provided at the second address bus in response to the second read control signal.

2. A dual port RAM according to claim 1, wherein the first controller comprises:
    a first pulse generator for receiving the first read signal and generating the first read control signal at a first timing period; and
    a second pulse generator for receiving a first write signal and generating a first write control signal to the memory cell array part at a second timing period;
    and wherein the second controller comprises:
    a third pulse generator for receiving the second read signal and generating the second read control signal at the first timing period; and
    a fourth pulse generator for receiving a second write signal and generating a second write control signal to the memory cell array part at the second timing period.

3. A dual port RAM according to claim 2, wherein data provided by the memory cell corresponding to the address signal provided at the first address bus is latched by the first latch circuit at the first timing period and writing of data to the memory cell corresponding to the address signal provided at the second address bus is carried out at the second timing period in response to the second write control signal.

4. A dual port RAM according to claim 3, wherein the address signal provided at the first address bus and the address signal provided at the second address bus represent the same address.

5. A dual port RAM according to claim 1, further comprising:
    a first processor for generating an address signal to the first address terminal and generating the first read signal; and
    a second processor for generating an address signal to the second address terminal and generating the second read signal.

* * * * *